United States Patent [19]

Saitoh et al.

[11] Patent Number: 5,770,347
[45] Date of Patent: Jun. 23, 1998

[54] PHOTOCURABLE AND THERMOSETTING COATING COMPOSITION AND METHOD FOR FORMATION OF SOLDER MASK FOR PRINTED CIRCUIT BOARD

[75] Inventors: Teruo Saitoh, Iwatsuki; Kazunobu Fukushima, Hatoyama-machi; Kyo Ichikawa, Niiza, all of Japan

[73] Assignee: Taiyo Ink Manufacturing Co., Ltd., Japan

[21] Appl. No.: 555,785

[22] Filed: Nov. 9, 1995

[30] Foreign Application Priority Data

Nov. 11, 1994 [JP] Japan ................................... 6-301700
Dec. 28, 1994 [JP] Japan ................................... 6-337585
May 26, 1995 [JP] Japan ................................... 7-151204

[51] Int. Cl.$^6$ ............................ G03F 7/032; G03F 7/038
[52] U.S. Cl. .................................. 430/280.1; 430/285.1; 430/287.1; 430/283.1; 430/281.1; 522/84
[58] Field of Search ........................... 430/285.1, 287.1, 430/280.1, 283.1, 281.1; 522/84

[56] References Cited

U.S. PATENT DOCUMENTS

| 4,145,222 | 3/1979 | Etoh et al. | 430/281.1 |
| 4,499,163 | 2/1985 | Ishimaru et al. | 430/284.1 |
| 5,009,982 | 4/1991 | Kamawachi et al. | 430/280.1 |
| 5,093,223 | 3/1992 | Iwasawa et al. | 430/280.1 |
| 5,153,101 | 10/1992 | Meier et al. | 430/281.1 |

FOREIGN PATENT DOCUMENTS

| 51-44922 | 4/1976 | Japan | 430/280 |
| 57-55914 | 4/1982 | Japan . | |
| 61-243869 | 10/1986 | Japan . | |
| 3-121154 | 5/1991 | Japan . | |

OTHER PUBLICATIONS

Saitoh et al (CA121:96035) Chemical Abstracts Online Service, English Abstract of Eur. Pat. Appl. EP 573053 A1 Printed Dec. 8, 1993.

*Primary Examiner*—Cynthia Hamilton
*Attorney, Agent, or Firm*—Ronald P. Kananen

[57] ABSTRACT

A photocurable and thermosetting coating composition which can be diluted with water is disclosed. This composition comprises a photopolymerizable resin having a number-average molecular weight in the range of from 500 to 50,000 and containing an aprotic ammonium salt-containing moiety in a proportion of from 0.2 to 4.0 mols per kilogram of the resin, a photopolymerization initiator, a thermosetting component, and a diluent. The photopolymerizable resin is obtained by the reaction of a polymer possessing a tertiary amino group with a monocarboxylic acid and a monoepoxy compound either or both thereof possessing a polymerizable unsaturated double bond. As the thermosetting component, at least one member selected from the group consisting of amino resins, cyclocarbonate compounds, blocked isocyanate compounds, and epoxy resins is used. A tack-free coating film is obtained by applying this composition to a printed circuit board and drying the applied layer of the composition. A delicate resist pattern can be formed by exposing the coating film to an actinic radiation and developing the unexposed areas of the coating film with water or a dilute aqueous acid solution. By thermally curing the patterned resist film, a solder resist film excelling in various properties expected of a solder resist is obtained.

17 Claims, No Drawings

PHOTOCURABLE AND THERMOSETTING COATING COMPOSITION AND METHOD FOR FORMATION OF SOLDER MASK FOR PRINTED CIRCUIT BOARD

BACKGROUND OF THE INVENTION

1. Field of the Invention

This invention relates to a photocurable and thermosetting coating composition and a method for the formation of a solder mask on a printed circuit board by the use of the coating composition. More particularly, the present invention relates to a photocurable and thermosetting coating composition which can be diluted with water and is useful for the formation of a solder mask on a printed circuit board, particularly suitable for the formation of a solder mask on a printed circuit board by the use of a spray coater or a curtain coater, and adaptable for uses normally requiring a given coating composition to be developed with water or a dilute aqueous acid solution.

2. Description of the Prior Art

Owing to the recent rapid advance of semiconductor parts, the electronic devices have been showing the trend toward attaining reductions in size and weight, embodying improvements of performance, and undergoing diversifications of function and, as a consequence, the printed circuit boards have been tending toward increased density of printed circuits and adoption of the technique of mounting component elements on the surface of board (surface mount technology). For the purpose of coping with this densification of printed circuits, a dry film type photoimageable solder resist and a liquid photoimageable solder resist have been developed.

As a dry film type photoimageable solder resist, published Japanese Patent Application, KOKAI No. (hereinafter referred to briefly as JP-A-) 57-55,914 discloses a photosensitive resinous composition suitable for the formation of dry film, which comprises urethane di(meth)acrylate, a linear macromolecular compound possessing a specific glass transition temperature, and a photosensitizer. The dry film type photoimageable solder resists of this class excel the liquid photoimageable solder resists in terms of safety from the problem of environmental pollution or fire hazard. They nevertheless have found virtually no acceptance for actual use because they are deficient in resistance to soldering temperature and in adhesiveness to a substrate and destitute of reliability of performance.

In contrast, as a liquid photoimageable solder resist, JP-A-61-243,869 and corresponding U.S. Pat. No. 5,009,982 issued to Kamayachi et al. on Apr. 23, 1991 disclose a photocurable and thermosetting liquid resist ink composition comprising a resin curable with an activated energy ray, which is obtained by the reaction of a saturated or unsaturated polybasic acid anhydride with a reaction product of a novolak type epoxy compound and an unsaturated monocarboxylic acid, a photopolymerization initiator, a diluent, and an epoxy compound. This composition can satisfy the characteristic properties for a solder resist. When it is applied to a substrate by the method of spray coating or curtain coating, since it defies dilution with water, it must be diluted with a large amount of organic solvent at the risk of entailing environmental pollution and fire hazard. Thus, it is in need of improvement. JP-A-03-121,154 discloses a photosensitive and thermosetting resinous composition which comprises a photosensitive prepolymer, a photopolymerization initiator, a diluent, and a melamine resin. This composition is deficient in resistance to electrolytic corrosion of the cured film and has the possibility of entailing environmental pollution and fire hazard because it is incapable of being diluted with water, like the resist ink composition mentioned above.

For the purpose of imparting water solubility to a given resin, the idea of using a water-soluble resin as a binder for that resin may be conceived. The well-known water-soluble resins include acrylic acid-containing acrylic copolymers neutralized with an amine, polyvinyl alcohols, carboxymethyl celluloses, and the like. In the case of a photosensitive composition which uses such a water-soluble resin as a main binder resin, since this binder resin does not possess any ethylenically unsaturated bond, the composition exhibits a slow photocuring behavior during the course of exposure to an actinic radiation and the cured film of the composition tends to be chemically corroded during the course of development. Further, since the resin belongs to an aliphatic family, the composition is so deficient in resistance to soldering temperature that it cannot be easily used as a solder resist. Sulfonic acid soda ($-SO_3Na$) may be cited as a group which is very effective in imparting water solubility to a resin. This group cannot be safely used in a solder resist which demands high reliability of performance because it degrades such electrical properties as electrical insulating properties and resistance to electrolytic corrosion. A water-containing or water-diluting quality solder resist composition whose cured film excels in such properties as resistance to soldering temperature, electrical properties, adhesiveness to a substrate, hardness, resistance to chemicals, and resistance to solvents, therefore, has been heretofore resigned as an impossibility. As an only one alternative, such an organic solvent-containing liquid photoimageable solder resist composition as mentioned above has been finding popular acceptance.

As a water-soluble photoimageable solder resist, U.S. Pat. No. 5,093,223 issued to Iwasawa et al. on Mar. 3, 1992 discloses a composition which has as essential components thereof an aprotic onium salt-containing resin derived from an aromatic epoxy resin and a photopolymerization initiator. This resinous composition has been at a disadvantage in allowing no easy production of itself and exhibiting insufficient photocuring properties. Further, it has no fully satisfactory properties as a solder resist because it lacks a thermosetting component.

SUMMARY OF THE INVENTION

It is, therefore, an object of the present invention to provide a photocurable and thermosetting coating composition capable of being diluted with water, which produces a solder resist film excelling in various properties required for solder resist such as adhesiveness to a substrate, hardness, resistance to soldering temperature, resistance to chemicals, electrical insulating properties, and resistance to electrolytic corrosion and which excels in such properties as developing properties and photocuring properties and enjoys freedom from environmental pollution and fire hazard.

Another object of the present invention is to provide a method for the formation of a solder mask on a printed circuit board, which allows the development of a coating layer of a photocurable and thermosetting coating composition formed on a printed circuit board by the use of water or dilute aqueous acid solution.

To accomplish the objects described above, in accordance with the present invention, there is provided a photocurable and thermosetting coating composition capable of being diluted with water, which comprises a photopolymerizable resin having a number-average molecular weight in the range of from 500 to 50,000 and containing a pendant aprotic ammonium salt-containing moiety represented by the following general formula (1) in a proportion of from 0.2 to 4.0 mols per kilogram of the resin (as solids), a photopolymerization initiator, a thermosetting compound, and a diluent:

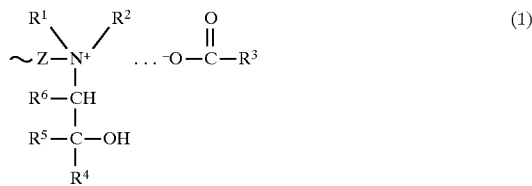

wherein Z represents a hydrocarbon or a hydrocarbon possessing an ester bond or an amide bond, each having 1 to 5 carbon atoms, $R^1$ and $R^2$ may be identical with or different from each other and respectively represent a hydrocarbon or a hydrocarbon whose hydrogen atom being substituted by a hydroxyl group, an ester group, an alkoxy group, or a halogen atom, each hydrocarbon having 1 to 8 carbon atoms, wherein these $R^1$ and $R^2$ may jointly form a heterocyclic ring in conjunction with a nitrogen atom with which they are coupled, $R^3$ and $R^4$ may be identical with or different from each other and respectively represent a hydrogen atom or a hydrocarbon having 1 to 18 carbon atoms, either or both of $R^3$ and $R^4$ possessing at least one polymerizable unsaturated group, wherein when both $R^3$ and $R^4$ are a hydrocarbon, the hydrogen atom of the hydrocarbon may be substituted by a hydroxyl group, an ester group, an alkoxy group, or a halogen atom, and $R^5$ and $R^6$ may be identical with or different from each other and respectively represent a hydrogen atom, a hydrocarbon or a hydrocarbon whose hydrogen atom being substituted by a hydroxyl group, an ester group, an alkoxy group, or a halogen atom, each having 1 to 18 carbon atoms, wherein $R^5$ and $R^6$ may jointly form a ring.

Preferably, the aforementioned photopolymerizable resin is a resin which is obtained by the reaction of a polymer possessing a tertiary amino group with a monocarboxylic acid and monoepoxy compound either or both thereof possessing a polymerizable unsaturated double bond.

The thermosetting compound to be used in the composition mentioned above may be one member or a combination of two or more members selected from the group consisting of amino resins, cyclocarbonate compounds, blocked isocyanate compounds, and epoxy resins.

Further in accordance with the present invention, there is provided a method for the formation of a solder mask on a printed circuit board, which comprises the steps of applying the aforementioned coating composition to a printed circuit board to form a coating layer thereon, drying the coating layer of the composition, selectively exposing the coating layer to an actinic radiation, developing the coating layer with water or a dilute aqueous acid solution to remove the unexposed areas of the coating layer thereby forming a resist pattern therein, and thereafter thermally curing the patterned resist layer.

DETAILED DESCRIPTION OF THE INVENTION

To be more specific, the aforementioned photopolymerizable resin possessing the aprotic ammonium salt-containing moiety is such a photopolymerizable resin as is obtained by causing a monocarboxylic acid possessing at least one unsaturated double bond (hereinafter referred to briefly as "unsaturated monocarboxylic acid (B-1)") or a saturated monocarboxylic acid (hereinafter referred to as "saturated monocarboxylic acid (B-2)") to react with a polymer possessing at least one tertiary amino group (hereinafter referred to briefly as "polymer (A)") and further causing a compound having one epoxy group (hereinafter referred to briefly as "epoxy compound (C-1)") or a compound having one epoxy group and also having at least one unsaturated double bond (hereinafter referred to briefly as "unsaturated epoxy compound (C-2)") to react with the resultant reaction product.

The aforementioned polymer (A) possessing at least one tertiary amino group may be any of the well-known polymers which answer the description. Among other well-known polymers, resins containing an amine moiety in a proportion of from 0.2 to 4.0 mols per kilogram of the resin and having a number-average molecular weight in the range of from 500 to 50,000, which are either of (1) polymers of compounds possessing at least one tertiary amino group and, at the same time, at least one unsaturated double bond (hereinafter referred to briefly as "compound (a-1)") or (2) copolymers of the compound (a-1) mentioned above with at least one species of compounds possessing at least one unsaturated double bond (hereinafter referred to briefly as "compound (a-2)"), prove to be particularly useful.

As typical examples of the compound (a-1) mentioned above, N,N-dimethylaminoethyl acrylate, N,N-diethylaminoethyl acrylate, N,N-di-n-propylaminoethyl acrylate, N,N-di-i-propylaminoethyl acrylate, N,N-dimethylaminopropyl acrylate, N,N-diethylamiopropyl acrylate, N,N-di-n-propylaminopropyl acrylate, N,N-di-i-propylaminopropyl acrylate, N,N-dimethylaminoethyl methacrylate, N,N-diethylaminoethyl methacrylate, N,N-di-n-propylaminoethyl methacrylate, N,N-di-i-propylaminoethyl methacrylate, N,N-dimethylaminopropyl methacrylate, N,N-diethylaminopropyl methacrylate, N,N-di-n-propylaminopropyl methacrylate, and N,N-di-i-propylaminopropyl methacrylate may be cited. Equimolar adducts of such epoxy group-containing acrylates or methacrylates as glycidyl acrylate, glycidyl methacrylate, 2-methyl-2,3-epoxy-propyl acrylate, and 2-methyl-2,2-epoxypropyl methacrylate with mono-secondary amine compounds may be cited as other typical examples. It is also allowable to use as a compound (a-1) such vinyl compounds as vinyl pyridine.

As typical examples of the compound (a-2) mentioned above, aromatic vinyls such as styrene, chlorostyrene, and α-methyl-styrene; acrylates, methacrylates, or fumarates having such a substituent as methyl, ethyl, propyl, isopropyl, n-butyl, isobutyl, t-butyl, amyl, 2-ethylhexyl, octyl, capryl, nonyl, dodecyl, hexadecyl, octadecyl, cyclohexyl, isobornyl, methoxyethyl, butoxyethyl, 2-hydroxyethyl, 2-hydroxypropyl, and 3-chloro-2-hydroxypropyl; monoacrylates or monomethacrylates of polyethylene glycol or monoacrylates or monomethacrylates of polypropylene glycol; vinyl esters such as vinyl acetate, vinyl butyrate, and vinyl benzoate; acrylic acid or methacrylic acid; acrylamides such as acrylamide, methacrylamide, N-hydroxymethyl acrylamide, N-hydroxymethyl methacrylamide, N-methoxymethyl acrylamide, N-ethoxymethyl acrylamide, and N-butoxymethyl acrylamide; and acrylonitrile or maleic anhydride may be cited. These compounds may be used either singly or in the form of a mixture of two or more members. From the standpoint of the glass transition point Tg of the relevant copolymer and the cost of the relevant compound itself, however, it is appropriate to use styrene, 2-hydroxyethyl (meth)acrylate, or methyl (meth)acrylate as the compound (a-2). In terms of the permeability of the ultimately produced coating to light, it is more appropriate to use methyl (meth)acrylate or 2-hydroxyethyl (meth) acrylate which contains no benzene ring.

The acid to be used for the reaction with the polymer (A) may be any of such well-known acids as unsaturated monocarboxylic acids (B-1) or saturated monocarboxylic acids (B-2). It is particularly appropriate to use a water-soluble saturated or unsaturated monocarboxylic acid having 1 to 9 carbon atoms. If the number of carbon atoms of the saturated or unsaturated monocarboxylic acid exceeds 9, the impartation of water solubility to the ultimately produced photopolymerizable resin will not be easily attained.

As concrete examples of the monocarboxylic acid (B-1) possessing at least one unsaturated double bond, acrylic acid, methacrylic acid, acrylic acid dimer, methacrylic acid dimer, lactone-modified acrylates, crotonic acid, monomethyl maleate, monomethyl fumarate, and monomethyl itaconate may be cited. These monocarboxylic acids may be used either singly or in the form of a mixture of two or more members.

As concrete examples of the saturated monocarboxylic acid (B-2), acetic acid, formic acid, trimethylacetic acid, lactic acid, hydroxyacetic acid, chloroacetic acid, octylic acid, and monomethyl adipate may be cited. These saturated monocarboxylic acids may be used either singly or in the form of a mixture of two or more members or in combination with the unsaturated monocarboxylic acid mentioned above.

The epoxy compounds (C-1) mentioned above include glycidol, epichlorohydrin, butyl glycidyl ether, phenyl glycidyl ether, ethylene oxide, propylene oxide, styrene oxide, cyclohexene oxide, and for example.

The unsaturated epoxy compounds (C-2) mentioned above include glycidyl methacrylate, glycidyl acrylate, α-methyl glycidyl methacrylate, N-[4-(2,3-epoxypropoxy)-3,5-dimethylbenzyl]acrylamide (for example, product of Kanegafuchi Chemical Industry Co., Ltd. marketed under a commercial name of "Kaneka Resin AXE"), and aryl glycidyl ether, for example.

It is also allowable to use (meth)acrylic monomers having an alicyclic epoxy group, such as the products of Daicel Chemical Ltd. marketed under trademark designations of "CYCLOMER" M-100 and A-200.

These epoxy compounds may be used either singly or in the form of a mixture of two or more members.

The preferred photopolymerizable resin having an aprotic ammonium salt-containing moiety represented by the aforementioned general formula (1) is a resin which is obtained by causing the aforementioned monocarboxylic acid and an epoxy compound represented by the following general formula (2) (providing either or both of the monocarboxylic acid and $R^4$ of the general formula (2) possess a polymerizable unsaturated double bond) to react with a copolymer having 0.5 to 4.0 mols, per kilogram of the copolymer, of a compound represented by the following general formula (3) and 1.0 to 6.0 mols, per kilogram of the copolymer, of styrene or methyl (meth)acrylate as essential components or a copolymer having these essential components plus 0.1 to 2.0 mols, per kilogram of the copolymer, of hydroxyethyl (meth)acrylate as another essential component.

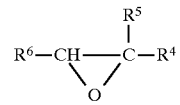

(2)

wherein $R^4$ represents a hydrogen atom, a hydrocarbon of 1 to 18 carbon atoms which may possess or not possess a polymerizable unsaturated double bond, or a hydrocarbon of 1 to 18 carbon atoms, whose hydrogen atom being substituted by a hydroxyl group, an ester group, an alkoxy group, or a halogen atom, and $R^5$ and $R^6$ may be identical with or different from each other and respectively represent a hydrogen atom, a hydrocarbon of 1 to 18 carbon atoms, or a hydrocarbon of 1 to 18 carbon atoms, whose hydrogen atom being substituted by a hydroxyl group, an ester group, an alkoxy group, or a halogen atom, wherein $R^5$ and $R^6$ may jointly form a ring.

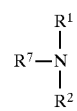

(3)

wherein $R^7$ represents a hydrocarbon of 2 to 7 carbon atoms having a polymerizable double bond or a hydrocarbon of 2 to 7 carbon atoms possessing an ester bond or an amide bond and $R^1$ and $R^2$ may be identical with or different from each other and respectively represent a hydrocarbon of 1 to 8 carbon atoms or a hydrocarbon of 1 to 8 carbon atoms, whose hydrogen atom being substituted by a hydroxyl group, an ester group, an alkoxy group, or a halogen atom, wherein $R^1$ and $R^2$ may jointly form a heterocyclic ring in conjunction with a nitrogen atom with which they are coupled.

Typical examples of the photopolymerization initiators mentioned above include benzoin and alkyl ethers thereof such as benzoin, benzoin methyl ether, benzoin ethyl ether, and benzoin isopropyl ether; acetophenones such as acetophenone, 2,2-dimethoxy-2-phenyl acetophenone, 2,2-diethoxy-2-phenyl acetophenone, 1,1-dichloroacetophenone; aminoacetophenones such as 2-methyl-1-[4-(methylthio)phenyl]-2-morpholino-aminopropan-1-one and 2-benzyl-2-dimethylamino-1-(4-morpholinophenyl)butan-1-one; anthraquinones such as 2-methylanthraquinone, 2-ethylanthraquinone, 2-t-butyl anthraquinone, and 1-chloroanthraquinone; thioxanthones such as 2,4-dimethylthioxanthone, 2,4-diethylthioxanthone, 2-chlorothioxanthone, and 2,4-di-isopropylthioxanthone; ketals such as acetophenone dimethyl ketal and benzyl dimethyl ketal; benzophenones such as benzophenone; and xanthones. These photopolymerization initiators may be used either singly or in the form of a combination of two or more members. Optionally such a photopolymerization initiator may be used in combination with one or more well-known conventional photosensitizers such as the tertiary amines.

The amount of the photopolymerization initiator to be used suitably falls in the range of from 1 to 30 parts by weight, preferably from 5 to 25 parts by weight, based on 100 parts by weight of the photopolymerizable resin mentioned above. If the amount of the photopolymerization initiator to be used is less than the lower limit of the range mentioned above, the resultant composition will suffer from inferior photocuring properties. Conversely, if the amount exceeds the upper limit of the range, the composition will entail the disadvantage of exhibiting inferior quality for solder resist.

As the thermosetting component mentioned above, one member or a mixture of two or more members selected from among amino resins, cyclocarbonate compounds, blocked isocyanates, and epoxy resins may be used.

The amino resins usable effectively herein include such methylated melamine resins as the products of Sanwa Chemicals Co., Ltd. marketed under trademark designations of NIKALAC MW-30, NIKALAC MW-30M, NIKALAC MW-22, NIKALAC MW-22A, NIKALAC MS-11, and NIKALAC MX-750 and the products of Mitsui-Cytec LTD. marketed under trademark designations of Cymel 300, Cymel 301, and Cymel 350; such mixed alkylated melamine resins as the products of Sanwa Chemicals Co., Ltd. marketed under trademark designations of NIKALAC MX-40 and NIKALAC MX-470 and the products of Mitsui-Cytec LTD. marketed under trademark designations of Cymel 238, Cymel 235, and Cymel 232; such imino group type melamine resins as the products of Mitsui-Cytec LTD. marketed under trademark designations of Cymel 325, Cymel 327, and Cymel XV-514; such benzoguanamine type amino resins as the products of Sanwa Chemicals Co., Ltd. marketed under trademark designations of NIKALAC BL-60 and NIKALAC BX-4000, such urea type amino resins as the products of Sanwa Chemicals Co., Ltd. marketed under trademark designations of NIKALAC MX-121 and NIKALAC MX-201; such melamine resins possessing an ethylenically unsaturated bond as the product of Sanwa Chemicals Co., Ltd. marketed under trademark designation of NIKALAC MX-302, and reaction products of these amino resins with N-methylol (meth)acrylamide, for example. In these amino resins, the average amount of formaldehyde bound to each of the active hydrogen atoms of the amino group (—NH$_2$) is properly not less than 65%, preferably not less than 80%. If this average amount is less than 65%, the developability of the composition will be unduly low because of the self-condensation of a given amino resin. The average degree of alkylation effected on a methylol group formed by the reaction of an amino group with formaldehyde is properly not less than 70%, preferably not less than 90%. If this average degree of alkylation is less than 70%, no good developability of the coating film will be attained because a curing reaction tends to proceed and a thermal fogging tends to occur during the step of drying. The amino resins which satisfy the requirements mentioned above, possess numerous points of crosslinkage, and impart more perfect properties to the coating film include NIKALAC MW-30, NIKALAC MW-30M, NIKALAC MW-22, NIKALAC MW-22A, NIKALAC MX-40, NIKALAC MX-301, Cymel 300, Cymel 301, and the reaction products of melamine resins as with N-methylol (meth)acryl amide, for example.

The compounds which are obtained by the reaction of carbon dioxide gas upon epoxy resins are counted among the aforementioned cyclocarbonate compounds. The epoxy resins mentioned above include such well-known epoxy compounds as glycidyl ethers of the bisphenol A type, hydrogenated bisphenol A type, bisphenol F type, bisphenol S type, phenol novolak type, cresol novolak type, bisphenol A-based novolak type, biphenol type, and bixylenol type; triglycidyl isocyanurate; and glycidyl amines such as N,N,N',N'-tetraglycidyl methaxylene diamine and N,N,N',N'-tetraglycidyl bisaminomethyl cyclohexane. Among other epoxy resins cited above, such powdery epoxy resins as bixylenol diglycidyl ether and triglycidyl isocyanurate prove to be desirable from the view points of developability and tack-free touch of finger of the coating film. The cyclocarbonate compounds which are produced from these epoxy resins may be used either singly or in the form of a mixture of two or more members.

The blocked isocyanates mentioned above include oxime blocked products (compounds whose isocyanate groups are blocked with oximes), caprolactam blocked products, and dimethyl amine blocked products of such well-known diisocyanates as tolylene diisocyanate, hexamethylene diisocyanate, isophorone diisocyanate, diphenylmethane diisocyanate, and naphthalene diisocyanate, for example. These blocked isocyanates can be used either singly or in the form of a mixture of two or more members.

As the epoxy resin to be used as a thermosetting component mentioned above, any of such well-known epoxy resins as the epoxy resins of the bisphenol A type, hydrogenated bisphenol A type, bisphenol F type, bisphenol S type, phenol novolak type, cresol novolak type, bisphenol A-based novolak type, biphenol type, and bixylenol type; alicyclic epoxy resins; diglycidyl ethers of polyethylene glycol or polypropylene glycol; and triglycidyl isocyanurate may be used. The epoxy resins may be used either singly or in the form of a mixture of two or more members. Among other epoxy resins cited above, such powdery epoxy resins as triglycidyl isocyanurate prove to be desirable from the view point of developability of the coating film. Further from the viewpoint of their reactivity, solubility, and life of dried coating film, the triglycidyl isocyanurate of the high-melting type having three epoxy groups thereof oriented in one direction relative to the plane of the S-triazine skeleton proves to be particularly preferable among other species of triglycidyl isocyanurate.

The amount of the thermosetting component to be incorporated in the composition is desired to be in the range of from 5 to 40 parts by weight, preferably 10 to 30 parts by weight, based on 100 parts by weight of the photopolymerizable resin mentioned above. If the amount of the thermosetting component is less than 5 parts by weight based on 100 parts by weight of the photopolymerizable resin, the characteristic properties such as adhesiveness to the substrate, resistance to soldering temperature, and resistance to chemicals which the cured coating film is expected to manifest will not be easily obtained. Conversely, if this amount exceeds 40 parts by weight, the thermosetting component except for the high-melting epoxy resin will suffer the disadvantage of incurring difficulty in obtaining a tack-free coating film.

As the diluent mentioned above, water and/or organic solvent may be used.

Examples of organic solvents include ketones, cellosolves, carbitols, cellosolve acetates, carbitol acetates, propylene glycol ethers, dipropylene glycol ethers, propylene glycol ether acetates, dipropylene glycol ether acetates, and aromatic hydrocarbons. Among other organic solvents mentioned above, water-soluble organic solvents prove to be particularly desirable. The amount of the organic solvent to be used is desired to be not more than 50 parts by weight, preferably not more than 30 parts by weight, based on 100 parts by weight of the photopolymerizable resin mentioned above. If the amount of the organic solvent to be used exceeds the upper limit mentioned above, though the quality of the composition is not adversely affected, the problem of environmental pollution and the problem of fire hazard will be entailed.

The photocurable and thermosetting coating composition of the present invention may optionally incorporate therein additionally a photopolymerizable monomer. The photopolymerizable monomers which are usable herein include hydroxyl group-containing acrylates such as 2-hydroxyethyl acrylate, 2-hydroxybutyl acrylate, pentaerythritol triacrylate, and dipentaerythritol pentaacrylate; acrylamide derivatives such as acrylamide and N-methylolacrylamide; water-soluble acrylates such as polyethylene glycol diacrylate and polypropylene glycol diacrylate; acrylates such as trimethylolpropane triacrylate and pentaerythritol tetraacrylate; and methacrylates corresponding to the acrylates mentioned above, for example. These photopolymerizable monomers may be used either singly or in the form of a combination of two or more members. Among other photopolymerizable monomers mentioned above, the hydrophilic group-containing (meth)acrylates prove to be particularly desirable in terms of liquid stability of the composition and the polyfunctional (meth)acrylates prove to be particularly desirable in terms of the photocuring properties. Further, such macromolecular compounds as polyvinyl alcohol, polyacrylamide, carboxymethyl cellulose, polyvinyl formal resin, and polyvinyl acetal resin which are water-soluble resins may be used as a protective colloid. The use of the protective colloid is effective in improving the liquid stability of the composition. Likewise for the purpose of improving the liquid stability of the composition, a surface-active agent may be used. From the viewpoints of electrical insulation properties, resistance to electrolytic corrosion, and liquid stability, the surface-active agent is desired to be of a nonionic type having an HLB (hydrophilic-lipophilic balance) value of not less than 13.

Optionally, such well-known and widely used inorganic fillers as barium sulfate, talc, silica, aluminum oxide, and aluminum hydroxide may be used for the purpose of enhancing the characteristic properties of the composition of the present invention such as adhesiveness to a substrate, hardness, and resistance to soldering temperature of the cured coating film. The amount of the inorganic filler to be used is desired to be in the range of not more than 100 parts by weight, preferably 5 to 50 parts by weight, based on 100 parts by weight of the photopolymerizable resin mentioned above. Further, well-known and widely used additives such as color pigments, thermopolymerization inhibitors, curing catalysts, thickening agents, anti-foaming agents, leveling agents, and coupling agents may be used, as occasion demands.

The photocurable and thermosetting coating composition of the present invention is capable of being diluted with water because it contains as the main components thereof a photopolymerizable resin possessing an aprotic ammonium salt-containing moiety represented by the general formula (1) mentioned above and an unsaturated double bond. The cured coating film obtained by exposing the composition to an actinic radiation in a prescribed pattern can easily form the patterned resist film by being developed with water or a dilute aqueous acid solution. Further, since the composition contains as a thermosetting component the amino resin, the cyclocarbonate compound, the blocked isocyanate, and/or the epoxy resin, which are stable in the composition system diluted with water, the produced composition itself forms a stable system diluted with water. Thus, there is ultimately obtained the photocurable and thermosetting coating composition which can be diluted with water and excels in such characteristic properties as developability and photocuring properties.

The photocurable and thermosetting coating composition which is obtained as described above and which is consequently enabled to be diluted with water is adjusted, when necessary by dilution with water, to a viscosity suitable for a selected method of coating and applied to a printed circuit board having a circuit already formed thereon, for example, by such a method as the spray coating, curtain coating, screen printing, or roll coating. The applied layer of the composition is dried at a temperature in the range of from 40° to 100° C., preferably not more than about 80° C., for example, to evaporate the organic solvent or water contained in the composition and to obtain a coating film which exhibits ideal tack-free touch of finger. The spray coating method and the curtain coating method can be advantageously used particularly among other methods of coating mentioned above because the photocurable and thermosetting coating composition of the present invention is capable of being diluted with water.

Thereafter, the coating film obtained as described above except in the areas to be soldered is selectively exposed to an actinic radiation through a photomask having a prescribed pattern formed therein and the unexposed areas of the coating film is developed with water or a dilute aqueous acid solution which sparingly stimulates the skin. Consequently, a delicate resist pattern can be easily formed with high efficiency. As the dilute aqueous acid solution to be used as a developing solution, inorganic acids such as hydrochloric acid and nitric acid; carboxylic acids such as acetic acid, formic acid, propionic acid, lactic acid, and glycolic acid; sulfonic acids such as p-toluenesulfonic acid; and acidic phosphoric esters may be used. Among other acids mentioned above, carboxylic acids prove to be particularly appropriate from the viewpoint of electrical insulating properties. Further, in terms of freedom from offensive odor, lactic acid and glycolic acid which are hydroxycarboxylic acids of high boiling points prove to be proper particularly among other carboxylic acids.

The resist film is subsequently thermally cured by being heated to a temperature in the range of from 140° to 180° C., for example, so as to effect thermal decomposition of the aprotic ammonium salt-containing moiety and, at the same time, crosslinkage of the thermosetting component. As a result, a solder resist film which excels in such properties as adhesiveness to the substrate, hardness, resistance to soldering temperature, resistance to chemicals, electrical insulating properties, and resistance to electrolytic corrosion which are expected of a solder resist can be obtained. Moreover, the photocurable and thermosetting coating composition of the present invention has practically no possibility of entailing environmental pollution or fire hazard because it by nature is formulated as the system to be diluted with water.

Examples of light sources which are advantageously used for the purpose of photocuring the composition include low-pressure mercury lamp, medium-pressure mercury lamp, high-pressure mercury lamp, ultra-high-pressure mercury lamp, xenon lamp, and metal halide lamp, for example. The laser beam may be utilized as the actinic radiation for exposure of the coating film. Besides them, electron beam, alpha rays, beta rays, gamma rays, X-rays, and neutron rays are likewise usable.

Now, the present invention will be described more specifically below with reference to working examples and comparative example. Wherever "parts" and "%" are mentioned hereinbelow, they invariably refer to those based on weight unless otherwise specified.

SYNTHETIC EXAMPLE 1

Into a flask equipped with a thermometer, a stirrer, a dropping funnel, and a reflux condenser, 176.9 parts of carbitol acetate was charged and heated in an atmosphere of nitrogen to 90° C. To the heated carbitol acetate, a mixed solution consisting of 393.0 parts of dimethyl aminoethyl methacrylate, 260.5 parts of styrene, 175 parts of carbitol acetate, and 32.68 parts of tert-butyl peroxy-2-ethyl hexanoate (an organic peroxide type polymerization initiator produced by Nippon Oils & Fats Co., Ltd. and marketed under trademark designation of "Perbutyl O") was added dropwise over a period of three hours. The resultant mixture was further stirred for four hours to obtain a resinous solution.

This resinous solution was heated to 80° C., then made to add 0.39 part of methyl hydroquinone and 181 parts of acrylic acid, stirred for 30 minutes, then made to add 357 parts of glycidyl methacrylate, and 80.5 parts of carbitol acetate, and further stirred for reaction for four hours. Consequently, a resinous solution of the resin containing an aprotic ammonium salt-containing moiety in a proportion of 2.1 mols per kilogram of the resin and having a number-average molecular weight of 7550 was obtained. Hereinafter, this resinous solution will be referred to briefly as "Varnish A".

SYNTHETIC EXAMPLE 2

Into a flask equipped with a thermometer, a stirrer, a dropping funnel, and a reflux condenser, 176.9 parts of carbitol acetate was charged and heated in an atmosphere of nitrogen to 90° C. To the heated carbitol acetate, a mixed solution consisting of 393.0 parts of dimethyl aminoethyl methacrylate, 260.5 parts of styrene, 175 parts of carbitol acetate, and 32.68 parts of tert-butyl peroxy-2-ethyl hexanoate (Perbutyl O) was added dropwise over a period of three hours. The resultant mixture was further stirred for four hours to obtain a resinous solution.

This resinous solution was heated to 90° C., then made to add 0.39 part of methyl hydroquinone and 225.3 parts of lactic acid, stirred for 30 minutes, then made to add 357 parts of glycidyl methacrylate, and further stirred for reaction for five hours. Consequently, a resinous solution of the resin containing an aprotic ammonium salt-containing moiety in a proportion of 2.0 mols per kilogram of the resin and having a number-average molecular weight of 7720 was obtained. Hereinafter, this resinous solution will be referred to briefly as "Varnish B".

SYNTHETIC EXAMPLE 3

Into a flask equipped with a thermometer, a stirrer, a dropping funnel, and a reflux condenser, 384.1 parts of carbitol acetate was charged and heated in an atmosphere of nitrogen to 100° C. To the heated carbitol acetate, a mixed solution consisting of 314.0 parts of dimethyl aminoethyl methacrylate, 129.2 parts of methyl methacrylate, 65 parts of hydroxyethyl methacrylate, 260 parts of styrene, 384.1 parts of carbitol acetate, and 38.4 parts of tert-butyl peroxy-2-ethyl hexanoate (Perbutyl O) was added dropwise over a period of two hours. The resultant mixture was further stirred for three hours to obtain a resinous solution.

This resinous solution was heated to 80° C., then made to add 0.72 part of methyl hydroquinone and 144.8 parts of acrylic acid, stirred for 30 minutes, then made to add 148.2 parts of glycidol, and further stirred for reaction for three hours. Consequently, a resinous solution of the resin containing an aprotic ammonium salt-containing moiety in a proportion of 1.9 mols per kilogram of the resin and having a number-average molecular weight of 7710 was obtained. Hereinafter, this resinous solution will be referred to briefly as "Varnish C".

SYNTHETIC EXAMPLE 4

Into a flask equipped with a thermometer, a stirrer, a dropping funnel, and a reflux condenser, 165.0 parts of dipropylene glycol monomethyl ether was charged and heated in an atmosphere of nitrogen to 110° C. To this heated solvent, a mixed solution consisting of 157.0 parts of dimethyl aminoethyl methacrylate, 208.0 parts of styrene, 130.0 parts of hydroxyethyl methacrylate, 165.0 parts of dipropylene glycol monomethyl ether, and 24.75 parts of tert-butyl peroxy-2-ethyl hexanoate (Perbutyl O) was added dropwise over a period of three hours. The resultant mixture was further stirred for five hours to obtain a resinous solution.

This resinous solution was heated to 90° C., then made to add 0.51 part of methyl hydroquinone and 72.2 parts of acrylic acid, stirred for 30 minutes, then made to add 150.1 parts of glycidyl methacrylate, and further stirred for reaction for four hours. Consequently, a resinous solution of the resin containing an aprotic ammonium salt-containing moiety in a proportion of 1.4 mols per kilogram of the resin and having a number-average molecular weight of 6820 was obtained. Hereinafter, this resinous solution will be referred to briefly as "Varnish D".

SYNTHETIC EXAMPLE 5

Into a flask equipped with a thermometer, a stirrer, a dropping funnel, and a reflux condenser, 385.5 parts of dipropylene glycol monomethyl ether was charged and heated to 70° C. in an atmosphere of nitrogen. To the heated dipropylene glycol monomethyl ether, a mixed solution consisting of 157.0 parts of dimethyl aminoethyl methacrylate, 400.0 parts of methyl methacrylate, 385.5 parts of dipropylene glycol monomethyl ether, and 22.3 parts of azobisisobutyronitrile was added dropwise over a period of four hours. Then, it was left reacting further for one hour and subsequently heated gradually to 120° C., to obtain a resinous solution.

This resinous solution was heated to 65° C. The heated solution and 0.4 part of methyl hydroquinone and 72.0 parts of acrylic acid added thereto were stirred for 30 minutes. The resultant mixture and 142.0 parts of glycidyl methacrylate added thereto were further stirred and made to react for six hours. As a result, a resinous solution of the resin containing an aprotic ammonium salt-containing moiety in a proportion of 1.3 mols per kilogram of the resin and having a number-average molecular weight of 5500 was obtained. Hereinafter, this resinous solution will be referred to briefly as "Varnish E".

SYNTHETIC EXAMPLE 6

Into a flask equipped with a thermometer, a stirrer, a dropping funnel, and a reflux condenser, 417.5 parts of dipropylene glycol monomethyl ether was charged and heated to 70° C. in an atmosphere of nitrogen. To the heated dipropylene glycol monomethyl ether, a mixed solution consisting of 157.0 parts of dimethyl aminoethyl methacrylate, 320.0 parts of methyl methacrylate, 130.0 parts of 2-hydroxyethyl methacrylate, 417.5 parts of dipropylene glycol monomethyl ether, and 24.3 parts of azobisisobutyronitrile was added dropwise over a period of four hours. Then, it was left reacting further for one hour and subsequently heated gradually to 120° C., to obtain a resinous solution.

This resinous solution was heated to 65° C. The heated solution and 0.4 part of methyl hydroquinone and 72.0 parts of acrylic acid added thereto were stirred for 30 minutes. The resultant mixture and 156.0 parts of α-methylglycidyl methacrylate added thereto were further stirred and made to react for 10 hours. As a result, a resinous solution of the resin containing an aprotic ammonium salt-containing moiety in a proportion of 1.2 mols per kilogram of the resin and having a number-average molecular weight of 6200 was obtained. Hereinafter, this resinous solution will be referred to briefly as "Varnish F".

Comparative Synthetic Example 1

Into a flask equipped with a thermometer, a stirrer, a dropping funnel, and a reflux condenser, 176.9 parts of carbitol acetate was charged and heated in an atmosphere of nitrogen to 90° C. To the heated carbitol acetate, a mixed solution consisting of 393.0 parts of dimethyl aminoethyl methacrylate, 260.5 parts of styrene, 175 parts of carbitol acetate, and 32.68 parts of tert-butyl peroxy-2-ethyl hexanoate (Perbutyl O) was added dropwise over a period of three hours. The resultant mixture was further stirred for four hours to obtain a resinous solution.

A water-soluble resinous solution was obtained by adding 181 parts of acrylic acid to the resinous solution obtained as described above. Hereinafter, this resinous solution will be referred to briefly as "Varnish G".

Example 1

A photosensitive resinous composition capable of being diluted with water was obtained by kneading the following components including Varnish A obtained in Synthetic Example 1 mentioned above with a three-roll mill.

| | |
|---|---|
| Varnish A | 60 parts |
| Pentaerythritol triacrylate | 4 parts |
| 2-Methyl-1-[4-(methylthio)phenyl]-2-morpholinoamino-propan-1-one | 4 parts |
| Phthalocyanine green | 1 part |
| NIKALAC ® MW-30M | 6 parts |
| Carbitol | 5 parts |
| Silica | 20 parts |
| Total: | 100 parts |

Example 2

A photosensitive resinous composition capable of being diluted with water was obtained by kneading the following components including Varnish B obtained in Synthetic Example 2 mentioned above with a three-roll mill.

| | |
|---|---|
| Varnish B | 50 parts |
| Pentaerythritol triacrylate | 4 parts |
| 2-Benzyl-2-dimethylamino-1-(4-morpholinophenyl)-butan-1-one | 4 parts |
| Phthalocyanine green | 1 part |
| Blocked isocyanate (product of Takeda Chemical Industries, Ltd. marketed under trademark designation of "Takenate" B-870N) | 6 parts |
| Blocked isocyanate (product of Mitsubishi Chemical Industries, Ltd. marketed under trademark designation of "Mitec" SW500) | 15 parts |
| Aluminum oxide | 20 parts |
| Total: | 100 parts |

Example 3

A photosensitive resinous composition capable of being diluted with water was obtained by kneading the following components including Varnish C obtained in Synthetic Example 3 mentioned above with a three-roll mill.

| | |
|---|---|
| Varnish C | 60 parts |
| Pentaerythritol triacrylate | 4 parts |
| 2-Benzyl-2-dimethylamino-1-(4-morpholinophenyl)-butan-1-one | 4 parts |
| Phthalocyanine green | 1 part |
| Cyclocarbonated triglycidyl isocyanurate | 10 parts |
| Imidazole compound curing catalyst (product of Shikoku Kasei Co., Ltd. marketed under product code of "2MZ-AZ") | 1 part |
| Silica | 20 parts |
| Total: | 100 parts |

Example 4

A photosensitive resinous composition capable of being diluted with water was obtained by kneading the following components including Varnish D obtained in Synthetic Example 4 mentioned above with a three-roll mill.

| | |
|---|---|
| Varnish D | 50 parts |
| Pentaerythritol triacrylate | 5 parts |
| 2-Benzyl-2-dimethylamino-1-(4-morpholinophenyl)-butan-1-one | 4 parts |
| Phthalocyanine green | 1 part |
| NIKALAC ® MW-30 | 6 parts |
| Cyclocarbonated triglycidyl isocyanurate | 4 parts |
| Mitec ® SW-500 | 10 parts |
| Silica | 20 parts |
| Total: | 100 parts |

Example 5

A photosensitive resinous composition capable of being diluted with water was obtained by kneading the following components including Varnish C obtained in Synthetic Example 3 mentioned above with a three-roll mill.

| | |
|---|---|
| Varnish C | 60 parts |
| Pentaerythritol triacrylate | 4 parts |
| 2-Benzyl-2-dimethylamino-1-(4-morpholinophenyl)-butan-1-one | 4 parts |
| Phthalocyanine green | 1 part |
| High-melting type triglycidyl isocyanurate (product of Nissan Chemicals Industries, Ltd. marketed under trademark designation of "TEPIC-H", melting point: about 150 to 156° C.) | 10 parts |
| Dimethylamine blocked isophorone diisocyanate (product of Sanapro K.K. marketed under product code of "UCAT-3503N") | 3 parts |
| Silica | 18 parts |
| Total: | 100 parts |

Example 6

A photosensitive resinous composition capable of being diluted with water was obtained by kneading the following components including Varnish E obtained in Synthetic Example 5 mentioned above with a three-roll mill. Hereinafter, this resinous composition will be referred to briefly as "E-1".

| | |
|---|---|
| Varnish E | 60 parts |
| 2-Benzyl-2-dimethylamino-1-(4-morpholinophenyl)-butan-1-one | 2 parts |
| 2-Methyl-1-[4-(methylthio)-phenyl]-2-morpholino-aminopropan-1-one | 4 parts |
| Silicone type anti-foaming agent (product of Shinetsu Chemical Industry Co., Ltd. marketed under product code of "KS-66") | 1 part |
| Phthalocyanine green | 1 part |
| NIKALAC ® MW-30 | 5 parts |
| Silica | 20 parts |
| Finely powdered silica | 2 parts |
| Dipropylene glycol monomethyl ether | 5 parts |
| Total: | 100 parts |

As a cross-linking agent for further enhancing the characteristic properties, a cross-linking agent composition (hereinafter referred to briefly as "E-2") was prepared by kneading the following components with a three-roll mill.

| | |
|---|---|
| Pentaerythritol triacrylate | 5 parts |
| Takenate ® B-870N | 10 parts |
| Melamine | 1 part |
| TEPIC-H ® | 10 parts |
| Finely powdered silica | 4 parts |
| Total: | 30 parts |

A photocurable and thermosetting composition capable of being diluted with water was obtained by mixing E-1 and E-2 prepared as described above in the E-1:E-2 ratio of 100:30 immediately prior to use.

Example 7

A photosensitive resinous composition capable of being diluted with water (hereinafter referred to briefly as "F-1") was prepared by kneading the following components including Varnish F obtained in Synthetic Example 6 described above with a three-roll mill.

| | |
|---|---|
| Varnish F | 60 parts |
| 2-Benzyl-2-dimethylamino-1-(4-morpholinophenyl)-butan-1-one | 2 parts |
| 2-Methyl-1-[4-(methylthio)phenyl]-2-morpholino-aminopropan-1-one | 4 parts |
| KS-66 | 1 part |
| Phthalocyanine green | 1 part |
| Silica | 25 parts |
| Finely powdered silica | 2 parts |
| Dipropylene glycol monomethyl ether | 5 parts |
| Total: | 100 parts |

As a cross-linking agent for further enhancing the characteristic properties, a cross-linking agent composition (hereinafter referred to briefly as "F-2") was prepared by kneading the following components with a three-roll mill.

| | |
|---|---|
| Pentaerythritol triacrylate | 5 parts |
| Takenate ® B-870N | 8 parts |
| Melamine | 1 part |
| TEPIC-H ® | 14 parts |
| Finely powdered silica | 2 parts |
| Total: | 30 parts |

A photocurable and thermosetting composition capable of being diluted with water was obtained by mixing F-1 and F-2 prepared as described above in the F-1:F-2 ratio of 100:30 immediately prior to use.

Comparative Example 1

| | |
|---|---|
| Varnish G | 60 parts |
| Pentaerythritol triacrylate | 4 parts |
| 2-Methyl-1-[4-(methylthio)phenyl]-2-morpholino-aminopropan-1-one | 4 parts |
| Phthalocyanine green | 1 part |
| NIKALAC ® MW-30M | 6 parts |
| Carbitol | 5 parts |
| Silica | 20 parts |
| Total: | 100 parts |

Evaluation of quality (1) Test for water-diluting property

A mixture of 10 g of each coating composition of the working examples and the comparative example described above with 5 g of water was visually examined to rate the appearance. The rating was made on the two-point scale, wherein:

○: Perfect dissolution, and

X: No dissolution but separation of water and resin.

(2) Developing property

Each of the coating compositions obtained in the examples and the comparative example cited above was applied by the screen printing to the entire surface of a copper-clad substrate having patterned circuits formed in advance thereon, dried at 75° C. for 30 minutes, and developed with tap water injected thereto under a spray pressure of 1.5 kg/cm$^2$ to determine the redissolving property of the coating composition. This redissolving property was rated by the three-point scale, wherein:

○: Total absence of coating composition from the substrate,

Δ: Coating composition remained only on the copper foil, and

X: Coating composition remained on the entire surface of the substrate.

Each of the coating compositions obtained in the examples and the comparative example cited above was applied by the screen printing onto the entire surface of a copper-clad substrate having patterned circuits formed in advance thereon and then dried at 75° C. for 30 minutes to give a tack-free coating film. Each coating film consequently formed on the substrates was exposed to an actinic radiation according to a solder resist pattern through a negative film tightly superposed thereon and then developed with tap water injected thereto under a spray pressure of 1.5 kg/cm$^2$ to form a resist pattern thereon. The coating film on the substrate was thermally cured at 150° C. for 30 minutes to prepare a test substrate.

(3) Resistance to soldering temperature

A given test substrate was coated with a rosin type flux, immersed for 30 seconds in a soldering bath set in advance at 260° C., cleansed with trichloroethane for removal of the flux, and visually examined as to swelling, peeling, and discoloration of the resist layer. The rating was made on the following three-point scale, wherein:

○: Perfect absence of any discernible change,

Δ: Only slight change of the resist layer, and

X: Presence of discernible swelling or peeling of the resist layer.

(4) Acid resistance

A given test substrate was immersed for 10 minutes in an aqueous 10% by volume sulfuric acid solution at normal room temperature, washed with water, and then subjected to a peel test using a cellophane adhesive tape to find the extents of peeling and discoloration consequently produced in the resist layer. They were rated on the following three-point scale, wherein:

○: Perfect absence of any discernible change,

Δ: Slight change of the resist layer, and

X: Presence of discernible peeling of the resist layer.

(5) Electrical insulating properties

The insulation resistance was determined by preparing a test substrate under the conditions mentioned above using a comb type electrode B coupon of IPC B-25 and applying a bias voltage of DC 500 V to the comb type electrode.

The results of these evaluations are collectively shown in the following table.

While certain specific working examples have been disclosed herein, the invention may be embodied in other specific forms without departing from the spirit or essential characteristics thereof. The described examples are therefore to be considered in all respects as illustrative and not restrictive, the scope of the invention being indicated by the appended claims rather than by the foregoing description and all changes which come within the meaning and range of equivalency of the claims are, therefore, intended to be embraced therein.

different from each other and respectively represent a substituted or unsubstituted hydrocarbon of 1 to 8 carbon atoms, wherein the substituent is a hydroxyl group, an ester group, an alkoxy group, or a halogen atom, or a heterocyclic ring jointly formed by hydrocarbons of said $R^1$ and $R^2$ in conjunction with a nitrogen atom with which they are coupled, $R^3$ and $R^4$ are identical with or different from each other and respectively represent a hydrogen atom or a substituted or unsubstituted hydrocarbon having 1 to 18 carbon atoms, wherein the substituent is a hydroxyl group, an ester group, an alkoxy group, or a halogen atom and either or both of $R^3$ and $R^4$ possess at least one polymerizable unsaturated group, and $R^5$ and $R^6$ are identical with or different from each other and respectively represent a hydrogen atom, a substituted or unsubstituted hydrocarbon of 1 to 18 carbon atoms, wherein the substituent is a hydroxyl group, an ester group, an alkoxy group, or a halogen atom, or a ring jointly formed by hydrocarbons of said $R^5$ and $R^6$.

2. The composition according to claim 1, wherein said photopolymerizable resin is a resin which is obtained by the reaction of (A) a polymer possessing a tertiary amino group with (B) a monocarboxylic acid and (C) a monoepoxy compound either or both thereof possessing a polymerizable unsaturated double bond.

TABLE

| Item of evaluation | Example | | | | | | | Comparative Example 1 |
|---|---|---|---|---|---|---|---|---|
| | 1 | 2 | 3 | 4 | 5 | 6 | 7 | |
| Water-diluting property | ○ | ○ | ○ | ○ | ○ | ○ | ○ | ○ |
| Developing Property | ○ | ○ | ○ | ○ | ○ | ○ | ○ | Δ |
| Resistance to soldering temperature | ○ | ○ | ○ | ○ | ○ | ○ | ○ | Δ |
| Acid resistance | ○ | ○ | ○ | ○ | ○ | ○ | ○ | X |
| Insulating property (insulation resistance Ω) | Not less than $10^{12}$ | Not less than $10^{12}$ | Not less than $10^{12}$ | Not less than $10^{12}$ | Not less than $10^{12}$ | Not less than $10^{12}$ | Not less than $10^{12}$ | Less than $10^{10}$ |

What is claimed is:

1. A photocurable and thermosetting coating composition capable of being diluted with water, comprising:

(a) a photopolymerizable resin having a number-average molecular weight in the range of from 500 to 50,000 and containing an aprotic ammonium salt-containing moiety represented by the following general formula (1) in a proportion of from 0.2 to 4.0 mols per kilogram of the resin, (b) a photopolymerization initiator, (c) at least one thermosetting compound selected from the group consisting of amino resins, cyclocarbonate compounds, blocked isocyanate compounds, and epoxy resins, and (d) a diluent:

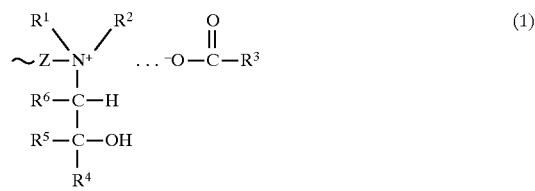

wherein Z represents a hydrocarbon or a hydrocarbon possessing an ester bond or an amide bond, each having 1 to 5 carbon atoms, $R^1$ and $R^2$ are identical with or 3. The composition according to claim 2, wherein said polymer possessing a tertiary amino group (A) is a copolymer having as essential components thereof 1.0 to 6.0 mols, per kilogram of the copolymer, of styrene and 0.5 to 4.0 mols, per kilogram of the copolymer, of a compound represented by the following general formula (3):

wherein $R^7$ represents a hydrocarbon of 2 to 7 carbon atoms having a polymerizable double bond or a hydrocarbon of 2 to 7 carbon atoms possessing an ester bond or an amide bond and $R^1$ and $R^2$ are identical with or different from each other and respectively represent a substituted or unsubstituted hydrocarbon of 1 to 8 carbon atoms, wherein the substituent is a hydroxyl group, an ester group, an alkoxy group, or a halogen atom, or a heterocyclic ring jointly formed by hydrocarbons of said $R^1$ and $R^2$ in conjunction with a nitrogen atom with which they are coupled.

4. The composition according to claim 2, wherein said polymer possessing a tertiary amino group (A) is a copolymer having as essential components thereof 1.0 to 6.0 mols, per kilogram of the copolymer, of styrene, 0.1 to 2.0 mols, per kilogram of the copolymer, of hydroxyethyl (meth)

acrylate, and 0.5 to 4.0 mols, per kilogram of the copolymer, of a compound represented by the following general formula (3):

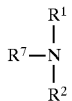
(3)

wherein $R^7$ represents a hydrocarbon of 2 to 7 carbon atoms having a polymerizable double bond or a hydrocarbon of 2 to 7 carbon atoms possessing an ester bond or an amide bond and $R^1$ and $R^2$ are identical with or different from each other and respectively represent a substituted or unsubstituted hydrocarbon of 1 to 8 carbon atoms, wherein the substituent is a hydroxyl group, an ester group, an alkoxy group, or a halogen atom, or a heterocyclic ring jointly formed by hydrocarbons of said $R^1$ and $R^2$ in conjunction with a nitrogen atom with which they are coupled.

5. The composition according to claim 2, wherein said polymer possessing a tertiary amino group (A) is a copolymer having as essential components thereof 1.0 to 6.0 mols, per kilogram of the copolymer, of methyl (meth)acrylate and 0.5 to 4.0 mols, per kilogram of the copolymer, of a compound represented by the following general formula (3):

(3)

wherein $R^7$ represents a hydrocarbon of 2 to 7 carbon atoms having a polymerizable double bond or a hydrocarbon of 2 to 7 carbon atoms possessing an ester bond or an amide bond and $R^1$ and $R^2$ are identical with or different from each other and respectively represent a substituted or unsubstituted hydrocarbon of 1 to 8 carbon atoms, wherein the substituent is a hydroxyl group, an ester group, an alkoxy group, or a halogen atom, or a heterocyclic ring jointly formed by hydrocarbons of said $R^1$ and $R^2$ in conjunction with a nitrogen atom with which they are coupled.

6. The composition according to claim 2, wherein said polymer possessing a tertiary amino group (A) is a copolymer having as essential components thereof 1.0 to 6.0 mols, per kilogram of the copolymer, of methyl (meth)acrylate, 0.1 to 2.0 mols, per kilogram of the copolymer, of hydroxyethyl (meth)acrylate, and 0.5 to 4.0 mols, per kilogram of the copolymer, of a compound represented by the following general formula (3):

(3)

wherein $R^7$ represents a hydrocarbon of 2 to 7 carbon atoms having a polymerizable double bond or a hydrocarbon of 2 to 7 carbon atoms having a polymerizable double bond or a hydrocarbon of 2 to 7 carbon atoms possessing an ester bond or an amide bond and $R^1$ and $R^2$ are identical with or different from each other and respectively represent a substituted or unsubstituted hydrocarbon of 1 to 8 carbon atoms, wherein the substituent is a hydroxyl group, an ester group, an alkoxy group, or a halogen atom, or a heterocyclic ring jointly formed by hydrocarbons of said $R^1$ and $R^2$ in conjunction with a nitrogen atom with which they are coupled.

7. The composition according to claim 2, wherein said polymer possessing a tertiary amino group (A) is a polymer of a compound possessing at least one tertiary amino group and at least one unsaturated double bond in one molecule thereof.

8. The composition according to claim 2, wherein said monocarboxylic acid (B) is a saturated or unsaturated monocarboxylic acid having 1 to 9 carbon atoms.

9. The composition according to claim 2, wherein said monoepoxy compound (C) is an epoxy compound represented by the following general formula (2):

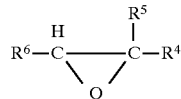
(2)

wherein $R^4$ represents a hydrogen atom or a substituted or unsubstituted hydrocarbon of 1 to 18 carbon atoms, wherein the substituent is a hydroxyl group, an ester group, an alkoxy group, or a halogen atom, and $R^5$ and $R^6$ are identical with or different from each other and respectively represent a hydrogen atom, a substituted or unsubstituted hydrocarbon of 1 to 18 carbon atoms, wherein the substituent is a hydroxyl group, an ester group, an alkoxy group, or a halogen atom, or a ring jointly formed by hydrocarbons of said $R^5$ and $R^6$.

10. The composition according to claim 1, wherein said photopolymerizable resin (a) is a resin which is obtained by causing a monocarboxylic acid and an epoxy compound represented by the following general formula (2), wherein either or both of the monocarboxylic acid and $R^4$ of the general formula (2) possessing a polymerizable unsaturated double bond, to react with a copolymer having 0.5 to 4.0 mols, per kilogram of the copolymer, of a compound represented by the following general formula (3) and 1.0 to 6.0 mols, per kilogram of the copolymer, of styrene or methyl (meth)acrylate:

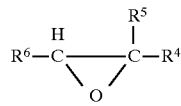
(2)

wherein $R^4$ represents a hydrogen atom or a substituted or unsubstituted hydrocarbon of 1 to 18 carbon atoms, wherein the substituent is a hydroxyl group, an ester group, an alkoxy group, or a halogen atom, and $R^5$ and $R^6$ are identical with or different from each other and respectively represent a hydrogen atom, a substituted or unsubstituted hydrocarbon of 1 to 18 carbon atoms, wherein the substituent is a hydroxyl group, an ester group, an alkoxy group, or a halogen atom, or a ring jointly formed by hydrocarbons of said $R^5$ and $R^6$,

(3)

wherein $R^7$ represents a hydrocarbon of 2 to 7 carbon atoms having a polymerizable double bond or a hydrocarbon of 2 to 7 carbon atoms having a polymerizable double bond or a hydrocarbon of 2 to 7 carbon atoms possessing an ester bond or an amide bond and $R^1$ and $R^2$ are identical with or different from each other and respectively represent a substituted or unsubstituted hydrocarbon of 1 to 8 carbon atoms, wherein the substituent is a hydroxyl group, an ester group, an alkoxy group, or a halogen atom, or a heterocyclic ring jointly formed by hydrocarbons of said $R^1$ and $R^2$ in conjunction with a nitrogen atom with which they are coupled.

11. The composition according to claim 1, wherein said photopolymerizable resin (a) is a resin which is obtained by causing a monocarboxylic acid and an epoxy compound represented by the following general formula (2), wherein either or both of the monocarboxylic acid and $R^4$ of the general formula (2) possessing a polymerizable unsaturated double bond, to react with a copolymer having 0.5 to 4.0 mols, per kilogram of the copolymer, of a compound represented by the following general formula (3), 1.0 to 6.0 mols, per kilogram of the copolymer, of styrene or methyl (meth)acrylate, and 0.1 to 2.0 mols, per kilogram f the copolymer, of hydroxyethyl (meth)acrylate:

(2)

wherein $R^4$ represents a hydrogen atom or a substituted or unsubstituted hydrocarbon of 1 to 18 carbon atoms, wherein the substituent is a hydroxyl group, an ester group, an alkoxy group, or a halogen atom, and $R^5$ and $R^6$ are identical with or different from each other and respectively represent a hydrogen atom, a substituted or unsubstituted hydrocarbon of 1 to 18 carbon atoms, hydrocarbon of 1 to 18 carbon atoms, whose hydrogen atom being wherein the substituent is a hydroxyl group, an ester group, an alkoxy group, or a halogen atom, or a ring jointly formed by hydrocarbons of said $R^5$ and $R^6$,

(3)

wherein $R^7$ represents a hydrocarbon of 2 to 7 carbon atoms having a polymerizable double bond or a hydrocarbon of 2 to 7 carbon atoms possessing an ester bond or an amide bond and $R^1$ and $R^2$ are identical with or different from each other and respectively represent a substituted or unsubstituted hydrocarbon of 1 to 8 carbon atoms, wherein the substituent is a hydroxyl group, an ester group, an alkoxy group, or a halogen atom, or a heterocyclic ring jointly formed by hydrocarbons of said $R^1$ and $R^2$ in conjunction with a nitrogen atom with which they are coupled.

12. The composition according to claim 1, wherein said photopolymerization initiator (b) is at least one compound selected from the group consisting of benzoin and alkyl ethers thereof, acetophenones, aminoacetophenones, anthraquinones, thioxanthones, ketals, benzophenones, and xanthones and present in an amount of from 1 to 30 parts by weight, based on 100 parts by weight of said photopolymerizable resin (a).

13. The composition according to claim 1, which comprises at least two different kinds of thermosetting compounds (c) selected from the group consisting of amino resins, cyclocarbonate compounds, blocked isocyanate compounds, and epoxy resins.

14. The composition according to claim 1, wherein said thermosetting compound (c) is present in an amount of from 5 to 40 parts by weight, based on 100 parts by weight of said photopolymerizable resin (a).

15. The composition according to claim 1, wherein said diluent is water.

16. The composition according to claim 1, wherein said diluent is an organic solvent and present in an amount of not more than 50 parts by weight, based on 100 parts by weight of said photopolymerizable resin (a).

17. The composition according to claim 1, which further comprises at least one additive selected from among photopolymerizable monomers, macromolecular compounds, surface-active agents, inorganic fillers, color pigments, thermopolymerization inhibitors, curing catalysts, thickening agents, anti-foaming agents, leveling agents, and coupling agents.

* * * * *